United States Patent [19]

Blissett et al.

[11] 4,346,427
[45] Aug. 24, 1982

[54] CONTROL DEVICE RESPONSIVE TO INFRARED RADIATION

[75] Inventors: Kitson Blissett, Freeport, N.Y.; Robert A. Dunbar, Swampscott, Mass.

[73] Assignee: Robert Rothenhaus, Bayside, N.Y.; a part interest

[21] Appl. No.: 202,592

[22] Filed: Oct. 31, 1980

Related U.S. Application Data

[63] Continuation of Ser. No. 53,249, Jun. 29, 1979, abandoned.

[51] Int. Cl.³ ............................................. C08B 13/18
[52] U.S. Cl. .................................. 361/173; 361/175; 340/600; 340/573
[58] Field of Search ................ 361/173, 175; 340/573; 250/340, 338

[56] References Cited

U.S. PATENT DOCUMENTS

| | | | |
|---|---|---|---|
| 3,439,358 | 4/1969 | Salmons | 340/258 |
| 3,924,130 | 12/1975 | Cohen et al. | 250/342 |
| 3,958,118 | 5/1976 | Schwarz | 250/221 |
| 4,029,176 | 6/1977 | Mills | 187/52 R |
| 4,031,408 | 6/1977 | Holz | 307/116 |
| 4,196,425 | 4/1980 | Williams, Jr. et al. | 340/573 |

Primary Examiner—J. D. Miller
Assistant Examiner—L. C. Schroeder
Attorney, Agent, or Firm—Gerard F. Dunne

[57] ABSTRACT

A device responsive to infrared radiation can control a current line to such items as interior lighting or room air conditioners in order to activate these items in response to the presence or absence of a person within their service area. The device includes an infrared detector comprised of a thermopile formed by thin-film techniques for producing detection signals amplified by a series of amplifier stages having filters passing only signals corresponding to motion of a human body. The amplified signals are led to the reset port of a timing circuit which will open the current line when no human motion is sensed within a predetermined time period. Further, the housing for the device includes a protruding neck portion carrying the infrared detector and adapted to be held by a retaining nut after insertion through a ceiling unit or the like.

58 Claims, 5 Drawing Figures

CONTROL DEVICE RESPONSIVE TO INFRARED RADIATION

This application is a continuation of our copending application Ser. No. 53,249 filed June 29, 1979 and now abandoned.

The present invention relates to control devices responsive to infrared radiation and, more particularly, to devices responsive to heat emanating from a human body for controlling an auxiliary current line.

Control devices responsive to heat emanating from a human body are known and are often used to provide a signal activating such items as security alarms when a person penetrates a secured area. These control devices, however, are often difficult to install, particularly in existing buildings, and typically lack adequate discrimination to prevent false triggering. Moreover, many of the known control devices simply produce a signal activating an alarm or the like when a person first enters a particular area, and thus cannot be adapted readily for other desirable uses.

One of these desirable uses is the control of auxiliary current lines powering such items as room air conditioners and interior lighting. These items often waste energy by being left on needlessly when no one is actually within the area served by these items.

Consequently, it is an object of the present invention to provide a device controlling a current line in response to the presence or absence of a human body.

It is a further object of the present invention to provide such a device having good discrimination so as to minimize false triggering.

An additional object of the present invention is to provide such a device which is relatively easy to install even in existing structures.

Another object of the present invention is to provide such a device which is compact, and can be manufactured simply and easily.

According to the present invention, the device comprises detection means including an infrared detector preferably comprised of a thermopile formed by thin-film techniques for producing detection signals in response to infrared radiation in the frequency spectrum emitted by the human body. These detection signals are amplified by a suitable circuit which also produces reset signals for those detection signals resulting from actual movements of a body emanating the detected infrared radiation. The reset signals are received by a timing circuit which produces a control signal opening the controlled current line after failing to receive a reset signal for a predetermined time period. In this way, the current line is opened only when movement of a human body is not detected by the device within a predetermined time period. Preferably, inhibiting means are connected to the timing circuit for activation by the control signal for maintaining the current line open until a reset signal is again produced to thus turn the item powered by the current line back on when a person enters the area served by the item.

The thermopile of the detector is preferably housed within a container having a small opening having a diameter of, for example, 0.18 inches, and being covered by a filter formed of infrared-transparent germanium coated to pass only a narrow band containing the frequency spectrum. The container may be fitted within a housing having an outer window including such materials as potassium bromide or silver chloride so as to be infrared transparent and spaced from the detector to prevent convective heat transfer thereto.

The circuit of the device receiving the detection signals preferably includes a plurality of amplifier stages having respective filters eliminating detection signals changing at a frequency below a predetermined value. By these means, the circuit retains only higher frequency signals corresponding to movement of a body emanating infrared radiation in the desired spectrum. Additionally, the circuit may include a preamplifier stage having a pair of transistors formed on the same substrate and coupled together through their respective emitters for reducing adverse temperature effects. Preferably, respective capacitors are connected across the base-emitter junction of each transistor of this pair and the collectors of the transistors are connected to respective inputs of an amplifier having a gain of, for example, 573.5.

More particularly, the circuit may include a second amplifier stage including a second amplifier receiving the output from the preamplifier stage and containing a filter having a cut-off frequency for eliminating low frequency signals as noted above. Preferably, the cut-off frequency is approximately 0.129 Hz and the second amplifier has a gain of approximately 14. Additionally, a third amplifier stage may be used, and it includes a third amplifier having a gain and filter similar to those of the second amplifier. The circuit also may include an encoding circuit connected to the output of the last amplifier stage for producing the reset signals. The preferred encoding circuit would include two parts, the first of which would produce a reset signal in response to a signal from the third amplifier stage becoming more positive, and the second part would produce a reset signal in response to a signal from the third amplifier stage becoming more negative.

In preferred form, the timing circuit includes a clock producing a train of clock pulses directed to a counter producing the control signal after a predetermined number of clock pulses has been counted. The counter may also include a reset port receiving the reset signals in order to start the counting of the clock pulses over. The counter may include a plurality of outputs each producing a respective control signal after counting a different number of clock pulses. In this way, a particular output may be selected for adjusting the time period.

When using the timing circuit described above, the inhibiting means may include a counter gate interposed between the clock and the counter. This counter gate would have a first input receiving the clock pulses and a control input adapted to receive a block signal in response to the control signal from the timing means for blocking the counter gate.

The electronic circuitry of the device of the present invention is preferably housed in a housing having a depending neck portion holding the infrared detector in its lower portion and including the outer window noted above. The housing further includes a retaining element adapted to be secured to the lower portion of the neck portion so that the device can be installed to a ceiling or wall by inserting the neck portion through an opening in the ceiling or wall and securing the retaining element to the lower portion of the neck portion. The neck portion may further include a separate locator fitting axially therein and having a recess in its end portion for receiving the infrared detector. Structures are formed on the upper portion of the locator for mating with complementary structures on the neck portion. In this way, the infrared detector can be positioned accurately in place in quite a simple manner. These complementary structures may, in preferred form, include longitudinally extending ribs protruding from the locator and longitudinal recesses formed in the neck portion.

Preferably, the end portion of the neck portion is generally circular in cross section and includes a bottom wall having a central opening therethrough. The outer window of the housing lies over this central opening and has an O-ring lying thereover. The O-ring is held in place against the outer window by a rim portion of the locator. Further, the opening in the bottom wall of the neck portion is preferably in the form of a conical frustum flaring outwardly at an angle of between approximately 90° and 120°. Also, the retaining element would have an opening therein formed as a conical frustum and adapted to align with the opening in the bottom wall of the neck portion.

Other features, advantages and objects of the present invention will become apparent from the following description of a preferred embodiment thereof taken in conjunction with the following drawings, in which.

Figure 2:
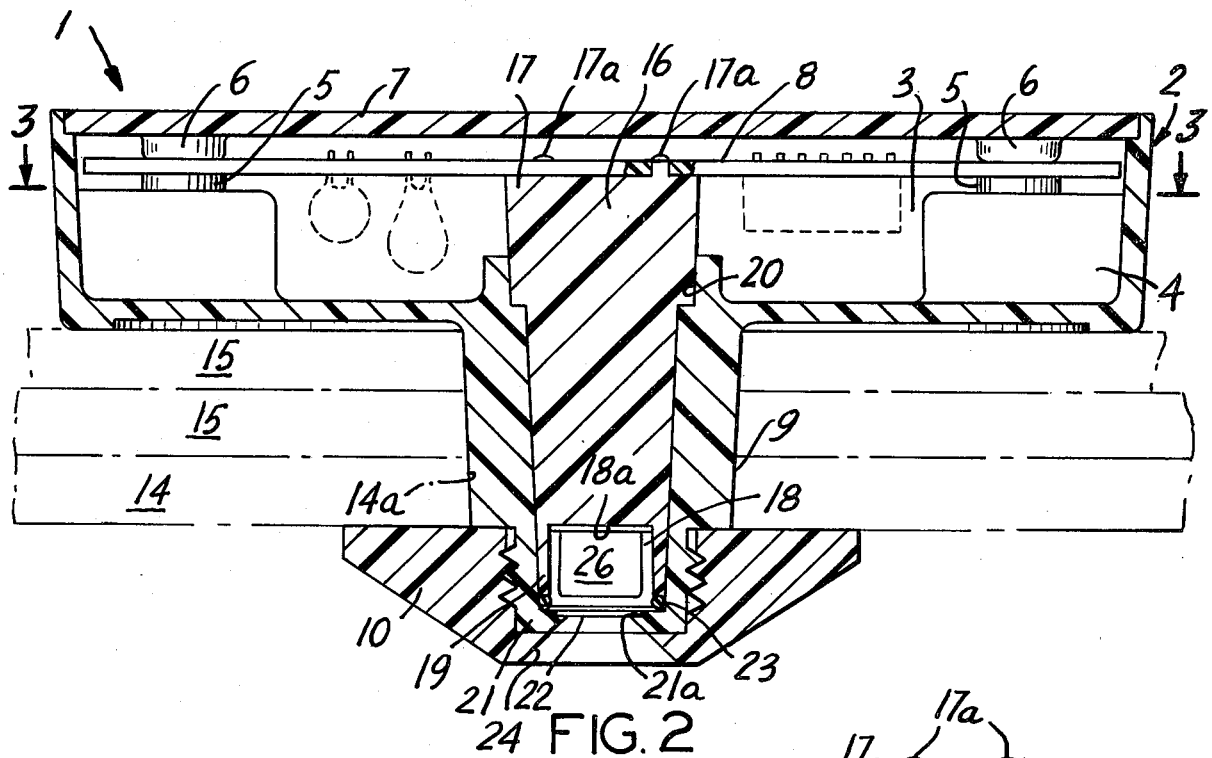
FIG. 2 is a sectional view of the structural aspects of the preferred embodiment.
Figure 3:
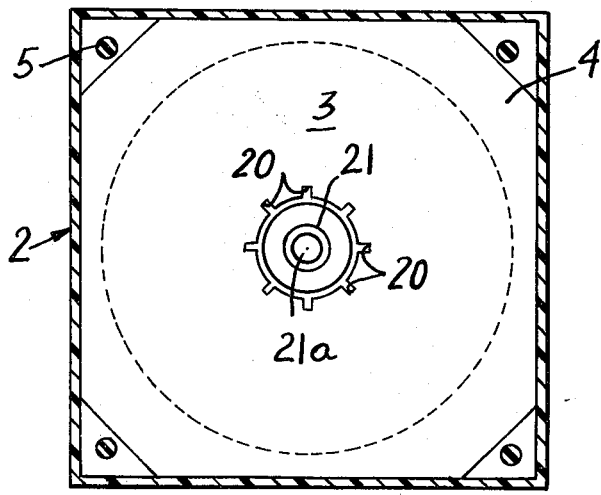

FIG. 3 is a top plan view of portions of the housing taken along line 3—3 of FIG. 2, absent the locator 16 and detector 2.

Figure 4:
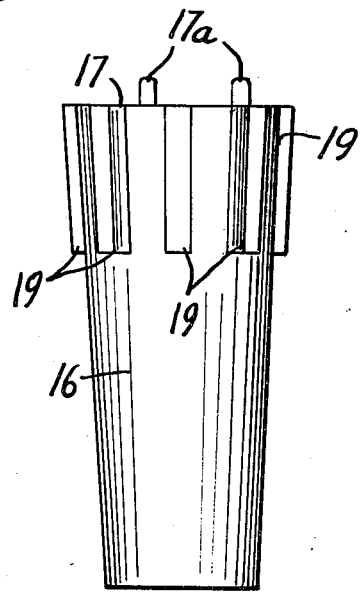

FIG. 4 is a side plan view of the locator shown in FIG. 2; and

Figure 5:
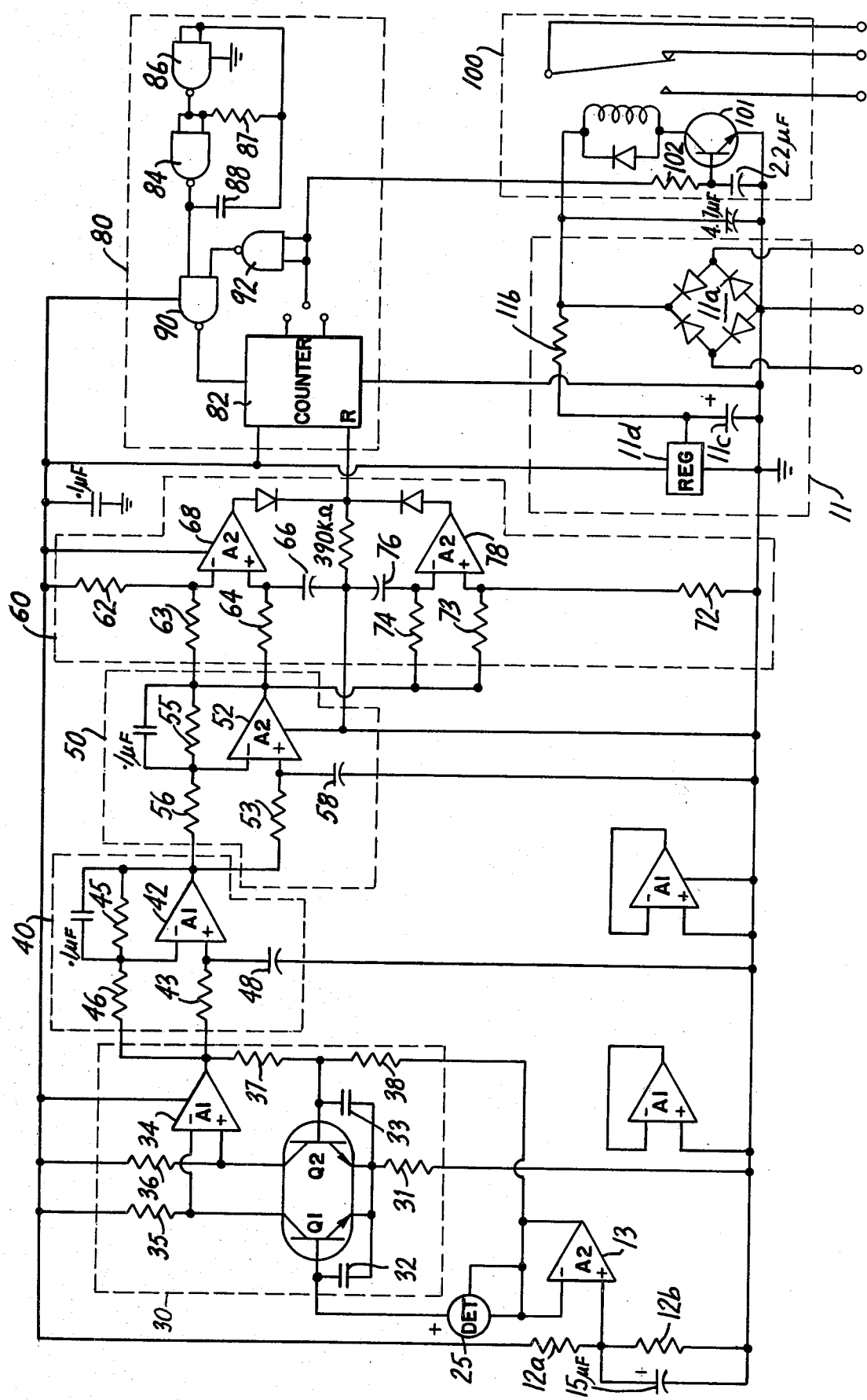

FIG. 5 is a diagram illustrating the circuit of a preferred embodiment of the present invention.

The control device of the illustrated embodiment includes a housing 1 formed of a synthetic material such as ABS copolymer plated with a metallic finish by known vacuum techniques. The housing includes a generally rectangular base portion 2 having a central recess area 3 surrounded by a peripheral seat portion 4. The peripheral seat portion carries a plurality of spacers 5 lying oppositely to spacers 6 carried by the back plate 7 of the housing. A printed circuit board 8 is held between aligned spacers 5 and 6 and carries the majority of the electronic components of the device. Depending from the central recess area 3 is a depending neck portion 9 adapted to receive a retaining element 10 on its lower portion as will be explained more fully below.

Figure 1:
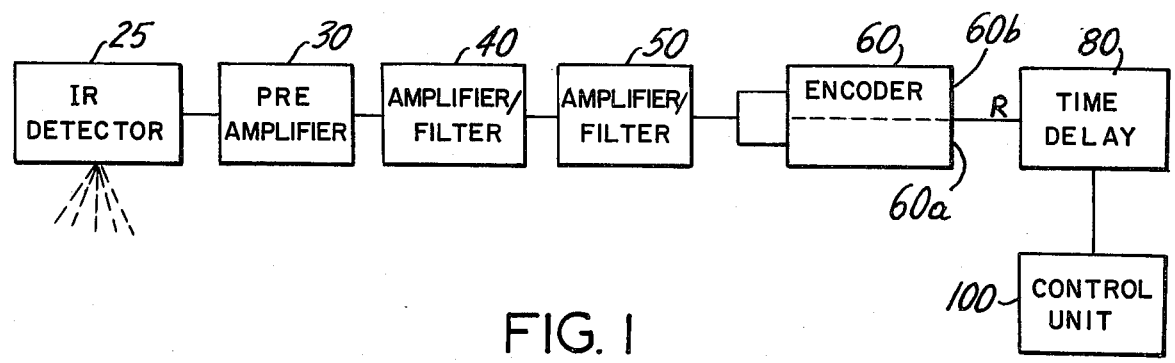
FIG. 1 is a block diagram illustrating electronic components of a preferred embodiment of the present invention.

The electronic components of the device are illustrated generally in the block diagram of FIG. 1 and include a detector 25 able to produce detection signals in response to infrared radiation in the frequency spectrum emitted by the human body. The detector includes a hermetically sealed container 26 fitted within the lower portion of the neck portion 9 and having a small opening of the order of 0.18 inches covered by a filter of infrared-transparent germanium coated to pass only a narrow band of infrared radiation containing the frequency spectrum emitted by the human body. This band preferably includes radiation having only wavelengths between 8 microns and 13½ microns so the filter thus serves as an optical filter narrowing the spectral sensitivity of the detector. Within the container 26 is a small multijunction thermopile formed from evaporated bismuth and antimony by known thin-film techniques. A suitable detector is the model 2M thermopile detector sold by Dexter Research Center of Dexter, Mich.

The signals produced by the infrared detector 25 are first amplified to a workable level by a preamplifier 30 and then passed to a series of amplifier stages 40 and 50 having respective low pass filters for eliminating those signals changing at a frequency below a predetermined value. The infrared detector will respond with relatively low frequency signals to changes in temperature of a stationary object within its field of view, and will respond with higher frequency signals to movements within the field of view of an object having a relatively constant temperature level. Consequently, the low pass filters sill serve as electronic filters eliminating signals produced by mere temperature change of a stationary object, such as those produced by incident radiation from a carpet being warmed or cooled from sunlight or an incandescent light bulb, and retain the higher frequency signals corresponding to movement of a body emanating radiation in the desired spectrum.

The signals emerging from the amplifier stage 50 are converted to a binary voltage level by an encoding circuit 60 divided into two parts. Part 60a responds to those signals becoming more positive so that motion of the infrared source towards the detector will be converted to a binary voltage level, and part 60b responds to those signals becoming more negative to thereby provide a similiar binary voltage level for motion of the infrared source away from the detector.

The binary voltage level from the encoding circuit 60 is passed to the reset port of a time-delay circuit 80 which produces a control signal after failing to receive a signal at its reset port for a predetermined period of time. This control signal is sent to a control unit 100 including a relay for opening a current line to be controlled so that the current line will be opened whenever movement of a human body is not detected within the time period set by the time-delay circuit 100.

The circuit diagram of FIG. 5 illustrates the preferred circuitry in more detail. A regulated power source 11 is formed by the one amp bridge rectifier 11a connected through the 470 Kohm resistor 11b across the 35 microfarad filter capacitor 11c and three terminal 12V regulator 11d. The regulated voltage from the power source is divided by the two 390 Kohm resistors 12a and 12b and sent to the splitter formed by amplifier 13. Amplifier 13 may be one of the group of four amplifiers designated A2 and provided by a single integrated circuit such as the LM324N sold by National Semiconductor. In such case, pins 12 and 13 of the integrated circuit would serve as the inputs of amplifier 12 and pin 14 would serve as its output. Amplifier 12 provides a 6V supply of proper impedance to the detector 25. The preamplifier 30 includes a pair of NPN transistors $Q_1$ and $Q_2$ formed on a common substrate and coupled together through their respective emitters. The two transistors will thus be at the same temperature to reduce internal noise, and receive a push-pull input from the detector 25 to reduce the undesirable effects of temperature drift and the like. The transistors have a common emitter resistor 31 preferably of 249 Kohms and respective 150 picofarad dipped silvered capacitors 32 and 33 connected across the base-emitter junction of each transistor for bypassing undesirable noise. The collectors of transistors $Q_1$ and $Q_2$ are connected to respective inputs of amplifier 34 and thus amplifier 34 will sense any difference in the potential drop across the 349 Kohm resistors 35 and 36 connected to the respective collectors of transistors $Q_1$ and $Q_2$. Amplifier 34, in a manner similar to amplifier 13, may be one of a group of four amplifiers designated A1 provided on a single integrated circuit LM324N and could be provided by using pins 2 and 3 as the inputs leading off the collector resistors and pin 1 as the output. Resistors 37 and 38 are selected so as to set the closed loop gain of the preamplifier 30 to 573.5 and, preferably, would be 390 Kohms and 820 Kohms, respectively.

The amplifier stage 40 includes an amplifier 42 receiving the output from the preamplifier 30 through resistor 43 of preferably 82 Kohms and has a gain of approximately 14 set by resistors 45 and 46. Resistors 45 and 46 may thus be of 390 Kohms and 27 Kohms, respectively. Amplifier 42 may be formed from the A1 grouping of amplifiers and is formed by using pins 5 and 6 as the inputs and pin 7 as the output. Capacitor 48, a 15 microfarad tantalum capacitor, operates with resistor 43 to provide the low-pass filter which will thus have a cut-off frequency of 0.129 Hz. The amplifier stage 50 is similiar to amplifier stage 40 and includes an amplifier 52 formed by connecting the pin 10 of the A2 grouping to the output of amplifier stage 40 through resistor 53 of preferably 82 Kohms. The gain of the amplifier stage 50 is also 14 and is provided by resistors 55 and 56 connected to input pin 9 of the A2 grouping. Capacitor 58 is similiar to capacitor 48 and thus provides with resistor 63 a low-pass filter having a cut-off frequency of 0.129 Hz.

The output of amplifier stage 50 is provided at pin 8 of the A2 grouping and is directed to the encoding circuit 60. In preferred form, the encoding circuit includes two parts each comprised of respective slope detectors. The first slope detector is made up of resistors 62, 63 and 64 and capacitor 66 together with amplifier 68 provided by using pins 2 and 3 of the A2 grouping as inputs and pin 1 as the output. This first slope detector produces a binary output signal in response to an output from amplifier stage 50 becoming more negative. The second slope detector includes resistors 72, 73 and 74 connected with capacitor 76 to amplifier 78 and produces a binary output signal in response to an output of pin 8 of the A2 grouping becoming more positive. Amplifier 78 is also provided from the A2 grouping by using pins 5 and 6 as the inputs and pin 7 as the output. Preferably, resistors 62 and 72 are of 3.9 megaohms and resistors 63 and 73 are 27 Kohms. Further, resistors 64 and 74 may be 390 Kohms and capacitors 66 and 76 may be 2.2 microfarad tantalum capacitors.

The output of either of the slope detectors is passed to the time-delay 80 and, more particularly, to the reset port of counter 82. The counter receives as its input a train of clock pulses generated in a clock circuit comprised by an astable oscillator formed by inverters 84 and 86 and the one megaohm resistor 87 and 0.1 microfarad capacitor 88. The pulses from the inverter 84 are directed to one input of a counter gate formed by NAND circuit 90 which together with inverter 92 provides an inhibitor to be described more fully below. Since the NAND circuit 90 is to be used, the inverters 84, 86 and 92 may also be constituted by NAND circuits having their respective inputs connected. In this way, a single integrated circuit having four NAND gates, such as the CMOS quad NAND circuit 4011B, may be effectively used.

The counter 82 is preferably the CMOS circuit 4040B binary counter which has a plurality of outputs. In the preferred embodiment, output pins 13 and 14 are used which develope an output pulse 4 minutes and 8 minutes, respectively, after a pulse is received at the reset pin 11. In this way, pins 13 and 14 may alternatively be selected to thereby provide a 4 minute or 8 minute delay. Of course, other delay periods can be obtained by selecting different output pins or changing the frequency of the astable oscillator by varying the values of resistor 87 and capacitor 88.

The inverter 92 receives the output pulse from the counter 82 to provide a "low" output to one control input of the counter gate to thereby block the pulses leading from the astable oscillator to the counter. In this way, the output signal from the counter will be maintained until a signal is again received at the reset port of the counter, presumably by a person entering the field of view of the infrared detector.

The output from the counter is used as the control signal to the control unit 100. The control unit includes an NPN switching transistor 101, such as a 2N3471, having its base connected through a 15 Kohm resistor 102 to the selected output of the counter 82. The control signal turns transistor 101 on to activate a relay adapted to control an auxiliary current line, preferably through a step-up transformer.

The control device may be installed easily even in existing building structures and the like due in large part to the depending neck portion carrying the infrared detector in its lower portion. The base portion 2 may be placed behind an opening 14a in a ceiling or wall unit 14 or the like with suitable resilient spacing elements 15 placed between the base portion and ceiling unit. The neck portion 9 may then be inserted through the opening 14a until its lower portion protrudes into the service area of the item controlled by the auxiliary current line. The retaining element 10 will then be tightened down on the protruding lower portion to secure the control device in place. The retaining element 10 preferably is threaded onto the lower portion of the neck portion, but may be secured in other ways, such as by being press-fitted or snapped into place through resilient locking tabs.

The neck portion 9 is generally circular in cross-section and receives a locator 16 fitting axially therein and having a rear surface 17 secured to the printed circuit board 8 by deformable posts 17a fixed within mating apertures in the board. In its end portion, the locator 16 has a recess 18 surrounded by a rim portion 19. The back wall 18a of the recess receives and holds the container 26 of the infrared detector. The upper portion of the locator 16 has a plurality of longitudinally extending ribs 19 spaced circumferentially therearound. These ribs 19 are complementary with longitudinal recesses 20 formed in the inner wall of the neck portion 9. In this way, the locator will be easily placed and held within the neck portion to position the detector accurately within the control device.

The end portion of the neck portion 9 includes a bottom wall 21 having a central opening 21a therethrough. An outer window 22 lies over this central opening and is held in spaced relation from the detector 25 by an O-ring 23 compressed between the rim portion 19 of the locator and the outer window 22. The outer window prevents air currents from reaching the surface of the detector container 26 to thereby reduce false triggering of the detector by convective heat transfer. The outer window 22 must, of course, be transparent to infrared radiation and preferably would include such materials as potassium bromide or silver chloride.

The field of view of the detector 25 is defined by the geometry of the opening 21a in the bottom wall of the neck portion and the opening 24 formed in the retaining element 10. The openings 21a and 24 are each preferably in the form of a conical frustum flaring outwardly to provide a conical field of view having an angle of between 90° and 120° at its apex.

As an optional feature, the control device may be provided with a cover member fitting over the entire housing and adapted to be mounted to a wall or ceiling unit. In this way, the device may be mounted directly to the outer surface of the wall or ceiling unit without the need for providing a hole therethrough. Such a cover could be snapingly engaged with the housing and would, of course, have a small opening aligned with the detector.

From the above, it is apparent that the present invention includes important features in both its circuitry and structural relationships. The control device may be installed readily and includes both optical and electronic filters to provide a high descrimination. Further, the device can be adapted for many uses and, as set forth above, can be made to close a current line to interior lighting or the like whenever someone enters the field of view of the detector, and will keep the current line closed as long as even slight motion, such as simple hand motions or even writing at a desk, is made within the detector's field of view. Thereafter, the control device will open the current line soon after no motion is sensed within the detector's field of view, i.e. after all persons have left the field of view, and will reclose the current line should someone again re-enter the field.

These and other important features may be employed in forms other than those described for the preferred embodiment and still incorporate the substance of the invention which is intended to be defined by the appended claims.

What is claimed is:

1. A device responsive to heat emanating from a human body for controlling an auxiliary current line, comprising
   detection means including an infrared detector for producing detection signals in response to infrared radiation in the frequency spectrum emitted by the human body;
   circuit means adapted to receive said detection signals for amplifying them and producing reset signals for those detection signals resulting from movement of a body emanating infrared radiation in said spectrum;
   timing means adapted to receive said reset signals for producing a control signal after failing to receive a reset signal for a time period preselected to be longer than the time period expected between movements of a human body within the field of view of said detector; and
   control means adapted to receive said control signal for controlling said current line in response thereto.

2. A device according to claim 1, further including inhibiting means connected to said timing means for maintaining said control signal until a reset signal is again produced.

3. A device according to claim 2, said inhibiting means receiving said control signal for activation thereof.

4. A device according to claim 1, said timing means including clock means for producing a train of clock pulses, counter means for receiving said clock pulses and producing said control signal after counting a predetermined number of said clock pulses, said counter means including reset means for starting the counting of said clock signals over upon receiving a reset signal.

5. A device according to claim 4, said counter means including a plurality of output ports connectable alternatively to said control means and each producing a control signal after counting a respective different number of said clock pulses.

6. A device according to claim 4, further including inhibiting means including a counter gate interposed between said clock means and said counter, said counter gate having a first input receiving said clock pulses and a control input adapted to receive a block signal in response to said control signal for blocking said counter gate.

7. A device according to claim 1, said infrared detection being comprised of a thermopile formed by thin-film techniques.

8. A device according to claim 7, said thermopile being housed within a container having an opening covered by a filter formed of infrared-transparent germanium coated to pass only a narrow band containing said frequency spectrum.

9. A device according to claim 8, said opening being approximately 0.18 inches in diameter.

10. A device according to claim 7 or 8, said infrared detector being fitted within a housing having an outer window spaced from the side of said detector receiving radiation to prevent convective heat transfer to said detector.

11. A device according to claim 10, said outer window including potassium bromide.

12. A device according to claim 10, said outer window including silver chloride.

13. A device according to claim 1, said circuit means including a preamplifier stage.

14. A device according to claim 13, said preamplifier stage having a pair of transistors formed on the same substrate and coupled together through their respective emitters.

15. A device according to claim 14, said preamplifier stage further including respective capacitors connected across the base-emitter junction of each transistor of said pair.

16. A device according to claim 14, the collectors of said transistors being connected to respective inputs of an amplifier.

17. A device according to claim 16, the gain of said amplifier being approximately 573.5.

18. A device according to claims 13 or 14, said circuit means further including a second amplifier stage including a second amplifier receiving the output from said preamplifier stage, said second amplifier stage including a filter having a cut-off frequency for eliminating all detection signals changing at a frequency below a predetermined value whereby higher frequency signals corresponding to movement of a body emanating infrared radiation in said spectrum will be retained.

19. A device according to claim 18, said cut-off frequency being approximately 0.129 Hz.

20. A device according to claim 18, said second amplifier having a gain of approximately 14.

21. A device according to claim 18, said circuit means further including a third amplifier stage including a third amplifier receiving the output from said second amplifier, said third amplifier stage including a filter similiar to that of said second stage.

22. A device according to claim 21, the cut-off frequency of the filter of said third stage being approximately 0.129 Hz.

23. A device according to claim 21, said third amplifier having a gain of approximately 14.

24. A device according to claim 21, said circuit means including encoding means connected to the output of said third amplifier for producing a reset signal in response to a signal from said third amplifier becoming more positive, and encoding means connected to the output of said third amplifier for producing a reset signal in response to a signal from said third amplifier becoming more negative.

25. A device according to claim 1, said circuit means including a plurality of amplifier stages each having a filter with a cut-off frequency for eliminating all detection signals changing at a frequency below a predetermined value whereby higher frequency signals corresponding to movement of a body emanating infrared radiation in said spectrum will be retained.

26. A device according to claim 25, said circuit means further including encoding means connected to the output of the last of said amplifier stages for producing said reset signals.

27. A device according to claim 1, further including a housing having a depending neck portion having said infrared detector in its lower portion and a retaining element adapted to be secured to the lower portion of said neck portion whereby said device can be installed to a ceiling or wall by inserting said neck portion through an opening therein and securing said retaining element to the lower portion of said neck portion.

28. A device according to claim 27, the bottom portion of said lower portion including an outer window spaced from said detector for preventing convective heat transfer to said detector.

29. A device according to claim 28, said outer window being formed from potassium bromide.

30. A device according to claim 28, said outer window being formed from silver chloride.

31. A device according to claim 28, further including a locator fitting axially within said neck portion, said locator having a recess in the end thereof for receiving said infrared detector and structures formed on the upper portion thereof for mating with complementary structures on said neck portion.

32. A device according to claim 31, said complementary structures including longitudinally extending ribs protruding from said locator and longitudinal recesses formed in said neck portion.

33. A device according to claim 31, the end portion of said neck portion being generally cylindrical and including a bottom wall having a central opening therethrough, said outer window lying over said opening, said locator having a peripheral rim portion surrounding said recess, and an O-ring lying over said outer window and held in position by said rim portion.

34. A device according to claim 28, the end portion of said neck portion being generally circular in cross section and including a bottom wall having a central opening therethrough, said opening being in the form of a conical frustum flaring outwardly at an angle between approximately 90° and 120°.

35. A device according to claim 34, said retaining element having an opening therein formed as a conical fustrum and adapted to align with the opening in said neck portion bottom wall.

36. A sensing system responsive to the presence of a human body for controlling the state of an auxiliary device adapted to be coupled to the sensing system, comprising
  a detector responsive to infrared radiation in the frequency spectrum emitted by a human body for producing signals indicative of the presence and movement of a source of infrared radiation proximate to the detector, said signals having frequency components relative to a pre-selected threshold level indicative of whether the source of infrared radiation is stationary or moving;
  circuit means for distinguishing between those signals having frequency components below said threshold indicative of a stationary source of infrared radiation and those signals having frequency components above said threshold which are indicative of a moving source of infrared radiation and producing in response to said signals above said threshold level detection signals indicative of the movement of a human body proximate to the detector; and
  means responsive to said detection signals for producing a control signal after failing to receive a detection signal for a time period selected to be longer than the time period expected between movements of the human body within the field of view of the detector for use in controlling the state of the auxiliary device.

37. A sensing system responsive to the presence of a human body for controlling the state of an auxiliary device adapted to be coupled to said sensing system, comprising
  a detector responsive to infrared radiation in the frequency spectrum emitted by a human body for producing signals indicative of the presence and movement of a source of infrared radiation proximate to the detector, said signals have frequency components indicative of whether the source of infrared radiation is stationary or moving;
  circuit means for distinguishing between those signals indicative of a stationary source of infrared radiation, and producing detection signals indicative of the movement of a human body proximate to the detector; and
  means responsive to said detection signals and adapted to be coupled to the auxiliary device for producing a control signal after failing to receive a detection signal for a time period selected to be longer than the time period expected between movements of a human body proximate to said detector for use in controlling the state of the auxiliary device.

38. A device responsive to heat emanating from a human body for controlling an auxiliary current line, comprising detection means sensing infrared radiation in the frequency spectrum emitted from the human body for producing a detection signal in response to a change in radiation in said spectrum, circuit means adapted to receive said detection signal for producing a control signal usable for controlling said current line, said circuit means including timing means for ending said control signal upon failing to receive another detection signal in a time period longer than that expected between movements of a human body within the field of view of said detection means.

39. A device according to claim 38, said circuit means including a plurality of amplifier stages each having a filter with a cut-off frequency for eliminating all detection signals changing at a frequency below a predetermined value whereby higher frequency signals corresponding to movement of a body emanating infrared radiation in said spectrum will be retained.

40. A device according to claim 38, said timing means including clock means for producing a train of clock pulses, counter means for receiving said clock pulses and producing said control signal after counting a predetermined number of said clock pulses, said counter means including reset means for starting the counting of said clock signals over upon receiving a detection signal.

41. A device according to claim 40, said counter means including a plurality of output ports connectable alternatively to said control means and each producing a control signal after counting a respective different number of said clock pulses.

42. A device according to claim 40, further including inhibiting means including a counter gate interposed between said clock means and said counter, said counter gate having a first input receiving said clock pulses and a control input adapted to receive a block signal in response to said control signal for blocking said gate.

43. A device according to claim 38, further including inhibiting means connected to said timing means for maintaining said control signal until a detection signal is again produced.

44. A device according to claim 43, said inhibiting means receiving said control signal for activation thereof.

45. A device according to claim 38, said timing means including digital circuitry, and said circuit means including encoding means for producing a digitalized signal for said timing means in response to a detection signal.

46. A device according to claim 45, said encoding means including two slope detectors, the first of said slope detectors being adapted to produce a digitalized signal in response to a detection signal becoming more positive in response to human movement toward said detection means, and the other of said slope detectors being adapted to produce a digitalized signal in response to a detection signal becoming more negative in response to human movement away from said detection means.

47. A device according to either claim 45 or 46, said digital circuitry including clock means for producing a train of clock pulses, counter means for receiving said clock pulses and producing said control signal after counting a predetermined number of said clock pulses, said counter means including reset means for starting the counting of said clock signals over upon receiving a detection signal.

48. A devide according to claim 47, said counter means including a plurality of output ports connectable alternatively to said control means and each producing a control signal after counting a respective different number of said clock pulses.

49. A device according to claim 48, further including inhibiting means including a counter gate interposed between said clock means and said counter, said counter gate having a first input receiving said clock pulses and a control input adapted to receive a block signal in response to said control signal for blocking said counter gate.

50. A device responsive to heat emanating from a human body for controlling an auxiliary current line; comprising detection means sensing infrared radiation in the frequency spectrum emitted from the human body for producing a detection signal in response to a change in radiation in said spectrum; circuit means adapted to receive said detection signal for producing a control signal usable for controlling said current line; said circuit means including timing means for ending said control signal upon failing to receive another detection signal in a time period longer than that expected between movements of a human body within the field of view of said detection means; said timing means including clock means for producing a train of clock pulses, counter means for receiving said clock pulses and producing said control signal after counting a predetermined number of said clock pulses, said counter means including reset means for starting the counting of said clock signals over upon receiving a detection signal.

51. A device responsive to heat emanating from a human body for controlling an auxiliary current line; comprising detection means sensing infrared radiation in the frequency spectrum emitted from the human body for producing a detection signal in response to a change in radiation in said spectrum; circuit means adapted to receive said detection signal for producing a control signal usable for controlling said current line; said circuit means including digital timing means for ending said control signal upon failing to receive another detection signal in a time period longer than that expected between movements of a human body within the field of view of said detection means and encoding means for producing a digitalized signal for said timing means in response to a detection signal; said encoding means including two slope detectors, the first of said slope detectors being adapted to produce a digitalized signal in response to a detection signal becoming more positive in response to a human movement toward said detection means, and the other of said slope detectors being adapted to produce a digitalized signal in response to a detection signal becoming more negative in response to human movement away from said detection means.

52. A housing for a device responsive to heat emanating from a human body for controlling an auxiliary current line, said housing having a depending neck portion adapted to receive an infrared detector in its lower portion, and a retaining element adapted to be secured to the lower portion of said neck portion whereby said device can be installed to a ceiling or wall by inserting said neck portion through an opening therein and securing said retaining element to the lower portion of said neck portion.

53. A device according to claim 52, the bottom portion of said lower portion including an outer window spaced from said detector for preventing convective heat transfer to said infrared detector.

54. A device according to claim 52, further including a locator fitting axially within said neck portion, said locator having a recess in the end thereof for receiving said infrared detector and structures formed on the upper portion thereof for mating with complementary structures on said neck portion.

55. A device according to claim 54, said complementary structures including longitudinally extending ribs protruding from said locator and longitudinal recesses formed in said neck portion.

56. A device according to claim 54, the end portion of said neck portion being generally cylindrical and including a bottom wall having a central opening therethrough, said outer window lying over said opening, said locator having a peripheral rim portion surrounding said recess, and on O-ring lying over said outer window and held in position by said rim portion.

57. A device according to claim 52, the end portion of said neck portion being generally circular in cross section and including a bottom wall having a central opening therethrough, said opening being in the form of a conical fustrum flaring outwardly at an angle between approximately 90° and 120°.

58. A device according to claim 57, said retaining element having an opening therein formed as a conical fustrum and adapted to align with the opening in said neck portion bottom wall.

* * * * *

REEXAMINATION CERTIFICATE (791st)
United States Patent [19]
Blissett et al.

[11] B1 4,346,427
[45] Certificate Issued  Dec. 8, 1987

[54] CONTROL DEVICE RESPONSIVE TO INFRARED RADIATION

[75] Inventors: Kitson Blissett, Freeport, N.Y.; Robert A. Dunbar, Swampscott, Mass.

[73] Assignee: Robert Rothenhaus, Bayside, N.Y.; a part interest

Reexamination Request:
No. 90/001,022, Jun. 2, 1986
No. 90/001,037, Jun. 20, 1986

Reexamination Certificate for:
Patent No.: 4,346,427
Issued: Aug. 24, 1982
Appl. No.: 202,592
Filed: Oct. 31, 1980

Related U.S. Application Data

[63] Continuation of Ser. No. 53,249, June 29, 1979, abandoned.

[51] Int. Cl.$^4$ ............................................. H01H 47/24
[52] U.S. Cl. ................................. 361/173; 361/175; 340/573; 340/600; 250/342
[58] Field of Search ............... 340/258 D, 258 R, 567, 340/565, 573; 250/83.3

[56] References Cited

U.S. PATENT DOCUMENTS

| | | | |
|---|---|---|---|
| 2,420,956 | 5/1947 | Kremers | 252/587 |
| 3,242,486 | 3/1966 | Corbell | 343/28 |
| 3,383,678 | 5/1966 | Palmer | 343/28 |
| 3,459,961 | 8/1969 | Ravas | 307/116 |
| 3,512,155 | 5/1970 | Bloice | 343/28 |
| 3,584,228 | 6/1971 | Kenyon et al. | 250/230 |
| 3,703,718 | 11/1972 | Berman | 340/567 |
| 3,727,216 | 4/1973 | Antonio | 343/5 PD |
| 3,796,208 | 3/1974 | Bloice | 128/2 R |
| 3,805,262 | 4/1974 | Klein | 343/28 |
| 3,839,640 | 10/1974 | Rossin | 250/353 |
| 3,896,311 | 7/1975 | Taylor et al. | 250/342 |
| 3,928,843 | 12/1975 | Sprout et al. | 340/258 |
| 3,988,726 | 10/1976 | Reiss et al. | 340/258 D |
| 4,016,428 | 4/1977 | Gutterman | 307/116 |
| 4,107,941 | 4/1978 | Hamilton | 62/186 |
| 4,195,234 | 3/1980 | Berman | 307/117 |

FOREIGN PATENT DOCUMENTS

2104528  2/1983  United Kingdom ............... 252/587

*Primary Examiner*—F. W. Isen

[57] ABSTRACT

A device responsive to infrared radiation can control a current line to such items as interior lighting or room air conditioners in order to activate these items in response to the presence or absence of a person within their service area. The device includes an infrared detector comprised of a thermopile formed by thin-film techniques for producing detection signals amplified by a series of amplifier stages having filters passing only signals corresponding to motion of a human body. The amplified signals are led to the reset port of a timing circuit which will open the current line when no human motion is sensed within a predetermined time period. Further, the housing for the device includes a protruding neck portion carrying the infrared detector and adapted to be held by a retaining nut after insertion through a ceiling unit or the like.

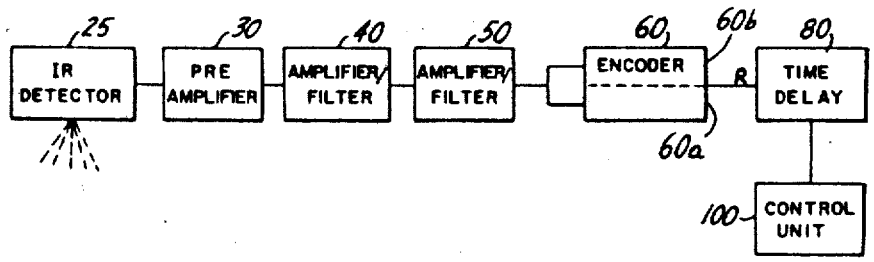

REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1-58 are cancelled.

* * * * *